United States Patent
Hsieh

(10) Patent No.: US 7,292,167 B2
(45) Date of Patent: Nov. 6, 2007

(54) APPARATUS FOR ERROR COMPENSATION OF SELF CALIBRATING CURRENT SOURCE

(75) Inventor: Jin-Sheng Hsieh, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/308,871

(22) Filed: May 18, 2006

(65) Prior Publication Data
US 2007/0210946 A1    Sep. 13, 2007

(30) Foreign Application Priority Data
Mar. 8, 2006  (TW) .............................. 95107715 A

(51) Int. Cl.
*H03M 1/10* (2006.01)

(52) U.S. Cl. ...................... 341/120; 341/135; 341/136; 341/144

(58) Field of Classification Search ................ 341/118, 341/120, 121, 144, 135, 136
See application file for complete search history.

(56) References Cited

U.S. PATENT DOCUMENTS

| | | | | |
|---|---|---|---|---|
| 5,870,044 | A * | 2/1999 | Dell'ova et al. | 341/120 |
| 6,166,670 | A * | 12/2000 | O'Shaughnessy | 341/136 |
| 6,304,201 | B1 * | 10/2001 | Moreland et al. | 341/154 |
| 6,331,830 | B1 * | 12/2001 | Song et al. | 341/121 |
| 6,407,688 | B1 * | 6/2002 | Greig | 341/136 |
| 6,473,015 | B2 * | 10/2002 | Andersson | 341/136 |
| 6,501,402 | B2 * | 12/2002 | Boxho | 341/120 |
| 6,909,387 | B2 * | 6/2005 | Li | 341/120 |
| 7,030,790 | B1 * | 4/2006 | Chen | 341/118 |

* cited by examiner

*Primary Examiner*—Linh Nguyen
(74) *Attorney, Agent, or Firm*—Jianq Chyun IP Office

(57) ABSTRACT

An apparatus for error compensation of a self calibrating current source adapted for compensating errors of at least one self calibrating current source. The compensation apparatus includes an imitative self calibrating current source, a current source reference apparatus and an error compensation apparatus. The imitative self calibrating current source is used to simulate the structure of the self calibrating current source to generate an error bias signal as the error of the self calibrating current source. The current source reference apparatus is used to generate an ideal bias signal. The error compensation apparatus generates a compensation bias signal to compensate errors of the self calibrating current source according to the difference of the error bias signal and the ideal bias signal.

16 Claims, 6 Drawing Sheets

APPARATUS FOR ERROR COMPENSATION OF SELF CALIBRATING CURRENT SOURCE

CROSS-REFERENCE TO RELATED APPLICATION

This application claims the priority benefit of Taiwan application serial no. 95107715, filed on Mar. 8, 2006. All disclosure of the Taiwan application is incorporated herein by reference.

BACKGROUND OF THE INVENTION

1. Field of Invention

The present invention relates to a current mirror technique. More particularly, the present invention relates to an apparatus for error compensation of a self calibrating current source.

2. Description of Related Art

For techniques of current source and current mirror, analog circuit, organic light-emitting diode (OLED) flat panel display and analog-to-digital converter etc. all need to use current source. FIG. 1 is a circuit diagram of a conventional self calibrating current source. N self calibrating current sources are shown in FIG. 1 and represented as CM-1~CM-n respectively. Each of the self calibrating current sources CM-1~CM-n includes three switches SW101~SW103, a transistor M100 and a capacitor C100. Further, the circuit in FIG. 1 includes a current source I100.

The operation of the circuit can be classified into two stages which are referred to as a current sampling stage and a current replicating stage. First, the CM-1 circuit enters the sampling stage. During the sampling stage, switches SW101 and SW102 are turned on, and the switch SW103 is turned off. At this time, the current source I100 generates a constant current to the transistor M100. The transistor M100 biases the current value to obtain an appropriate gate-to-source voltage ($V_{gs}$), and charges the capacitor C100. When the current sampling stage of CM-1 is finished, the current sampling stages of CM-2~CM-n are performed sequentially. Then, the circuit enters the current replicating stage. During the current replicating stage, CM-1~CM-n are started simultaneously. At this time, the switch SW101 and the switch SW102 are turned off, and the switch SW103 is turned on. The gate of the transistor M100 receives charges stored by the capacitor C100 as the gate-to-source voltage (Vgs) of the transistor M100, so as to provide a replicated current. Assume that the gate-to-source voltage (Vgs) of the transistor M100 at this moment is identical to the gate-to-source voltage by biasing the sample current during the current sampling stage, the replicated currents output by the CM-1~CM-n circuits are identical to the constant current generated by the current source I100.

However, in the above operation, as the switch SW101 may cause a charge injection effect, and parasitic capacitance effect may exist between switches, a charge sharing effect may occur when the switches are turned on. The above undesired effects may result in error of the voltage stored in the capacitor C100. When the transistor M100 converts the voltage into current, the error of the voltage is squared in the current, thereby resulting in an extremely large error of the replicated current. Furthermore, the capacitor C101 may have a very small current leakage, which will cause the loss of the charges stored by the capacitor and the attenuation of the stored signal after a long time of reaction, which thereby results in error of the replicated current.

SUMMARY OF THE INVENTION

One object of the present invention is to provide an apparatus for error compensation of a self calibrating current source, so as to compensate the error of the replicated current caused by the current leakage of the capacitor in the self calibrating current source, and compensate the error of the replicated current caused by the undesired effects of the switching of the switches or the semiconductor process.

Another object of the present invention is to provide an apparatus for error compensation of a self calibrating current source. Within a very low cost, the apparatus can compensate the error of the replicate current caused by the error in the sampling value of the capacitor in the self calibrating current source which affects the accuracy of the transistor mapping current, and compensate the error of the replicated current caused by the undesired effects of the switching of the switches or the semiconductor process.

According to the above objects, the present invention provides an apparatus for error compensation of a self calibrating current source adapted for compensating errors of at least one self calibrating current source. The compensation apparatus includes an imitative self calibrating current source, a current source reference apparatus and an error compensation apparatus. The imitative self calibrating current source is used to simulate the structure of the self calibrating current source to generate an error bias signal in response to the error of the self calibrating current source. The current source reference apparatus is used to generate an ideal bias signal. The error compensation apparatus generates a compensation bias signal to compensate the error of the self calibrating current source according to the difference of the error bias signal and the ideal bias signal.

According to the apparatus for error compensation of a self calibrating current source described in the preferred embodiments of the present invention, the aforementioned error compensation apparatus includes a buffer amplifier and an error amplifying circuit. The buffer amplifier includes a first input end, a second input end and an output end, wherein the output end is coupled to the second input end, and the first input end receives the error bias signal. The first input end of the error amplifying circuit receives the ideal bias signal, and the second input end of the error amplifying circuit is coupled to the output end of the buffer amplifier. The difference of the signals between the first output end and the second output end of the error amplifying circuit is amplified, and the compensation bias signal is generated and output at the output end.

The present invention further provides an apparatus for error compensation of a self calibrating current source, for compensating errors of at least one self calibrating current source. The compensation apparatus includes an imitative self calibrating current source and an error compensation apparatus. The imitative self calibrating current source is used to simulate the structure of the self calibrating current source to generate an error current signal in response to the error of the self calibrating current source. The error compensation apparatus receives the error current signal, and generates a compensation bias signal to compensate the error of the self calibrating current source according to the error current signal.

According to the apparatus for error compensation of a self calibrating current source described in the preferred embodiments of the present invention, the aforementioned imitative self calibrating current source includes a second transistor, a second capacitor and a third switch. The source of the second transistor is coupled to a first voltage, and the current flowing through the second transistor is determined according to the bias of its gate and source. One end of the second capacitor is coupled to the gate of the second transistor, and the other end of the second capacitor is coupled to the first voltage. The third switch includes a first end and a second end, wherein the first end is coupled to the gate of the first transistor, and the second end is coupled to the drain of the second transistor. Further, the aforementioned error compensation apparatus includes a third transistor, wherein the source of the third transistor is coupled to the first voltage, the gate is coupled to the drain, and the drain is coupled to the drain of the second transistor. The gate voltage of the third transistor serves as the compensation bias signal to compensate the error of the self calibrating current source.

The present invention adopts the imitative self calibrating current source to simulate the structure of the self calibrating current source, so as to generate an error as the error of the self calibrating current source to serve as a reference. On one hand, after the error bias signal of the imitative self calibrating current source is compared with an ideal bias, a compensation bias signal is generated and biased according to the self calibrating current, so as to compensate the error of the replicated current caused by the current leakage of the capacitor in the self calibrating current source, and compensate the error of the replicated current caused by the undesired effects of the switches. On the other hand, the error current of the imitative self calibrating current source is transferred to the error compensation apparatus. Next, the error compensation apparatus generates a compensation bias signal according to the current, so as to bias the self calibrating current. Therefore, the above undesired effects can be compensated at a very small cost.

In order to make the aforementioned and other objects, features and advantages of the present invention comprehensible, preferred embodiments accompanied with figures are described in detail below.

DESCRIPTION OF EMBODIMENTS

Figure 1:
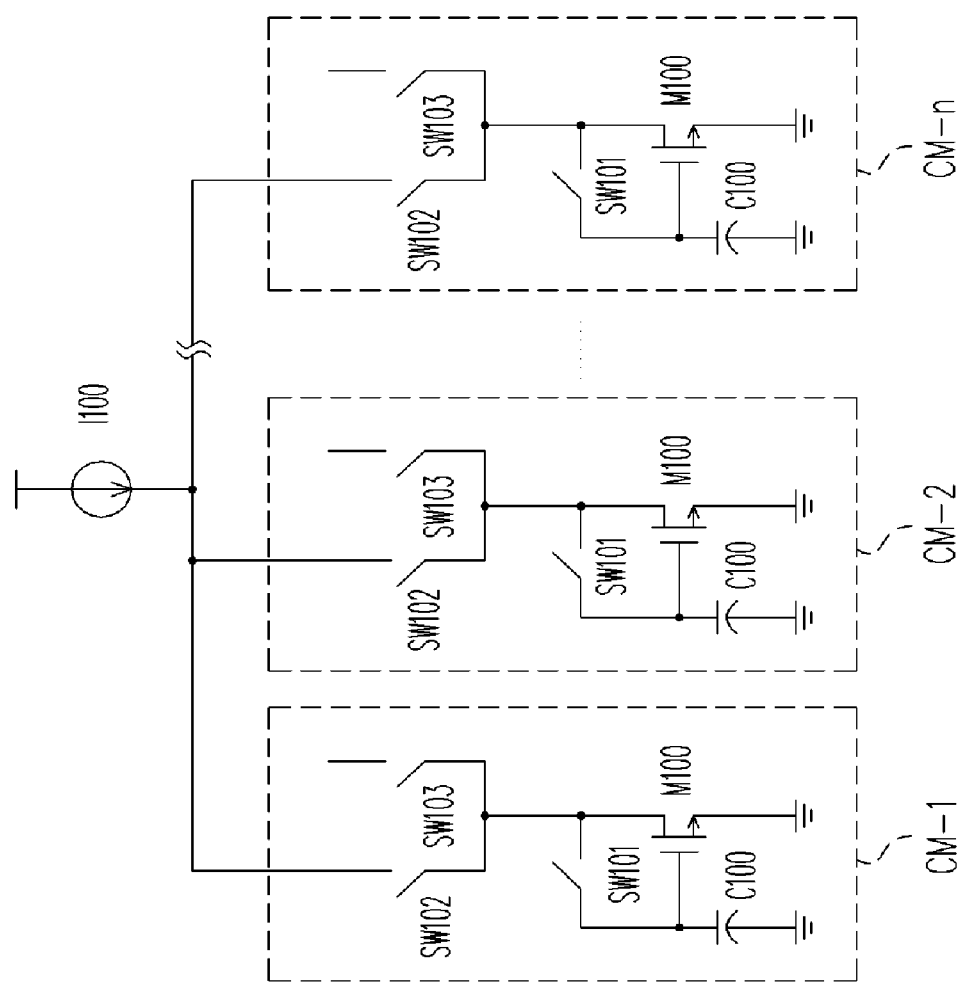
FIG. 1 is a circuit diagram of a conventional self calibrating current source.
Figure 2:
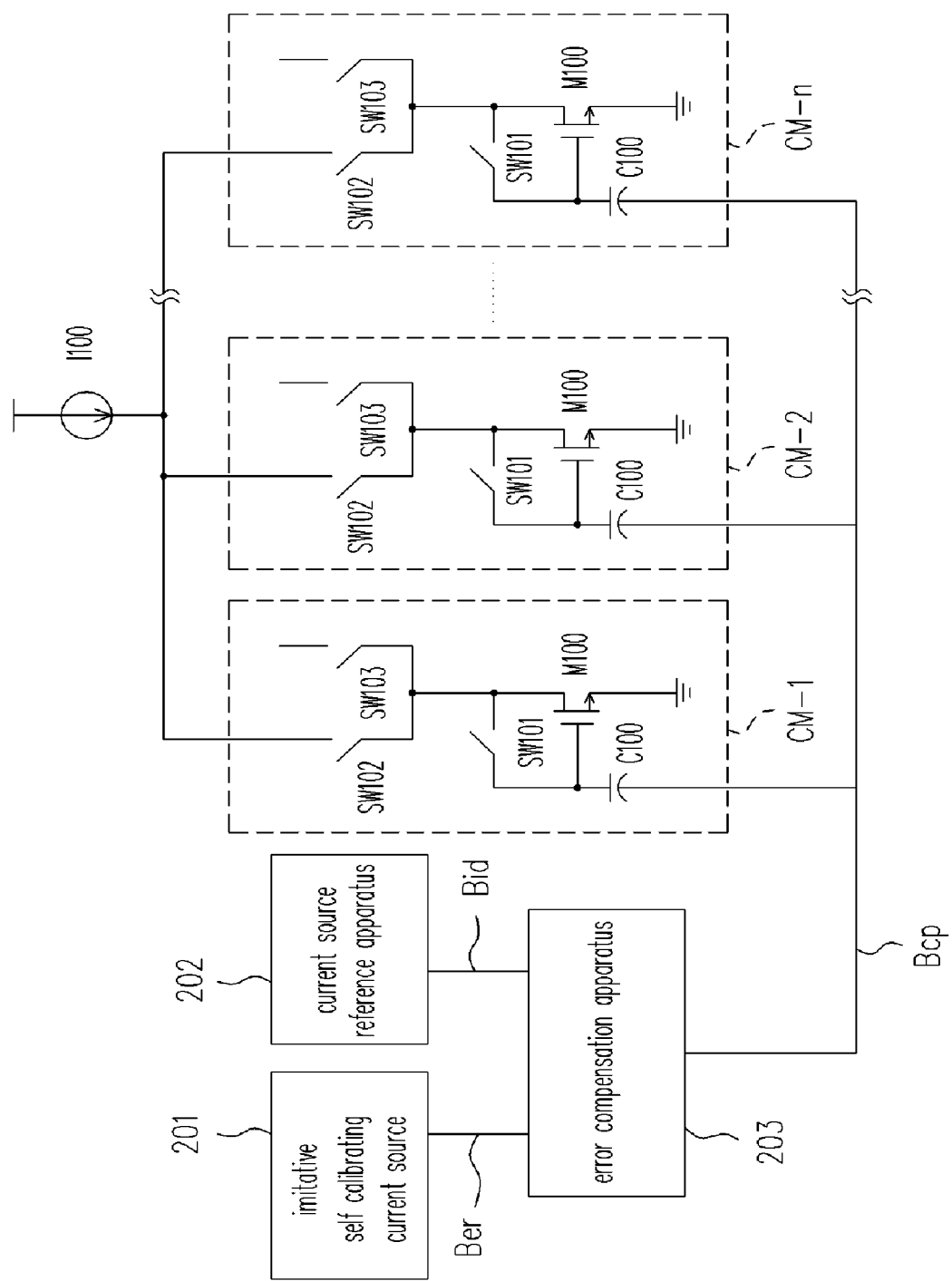
FIG. 2 is a circuit diagram of an apparatus for error compensation of a self calibrating current source according to the embodiment of the present invention.

FIG. 2 is a circuit diagram of an apparatus for error compensation of a self calibrating current source according to the embodiment of the present invention. Referring to FIG. 2, the apparatus is used to compensate the self calibrating current sources CM-1~CM-n in FIG. 2. The apparatus for error compensation of a self calibrating current source includes an imitative self calibrating current source 201, a current source reference apparatus 202 and an error compensation apparatus 203. The imitative self calibrating current source 201 is used to simulate the structure of the self calibrating current sources CM-1~CM-n to generate an error bias signal Ber in response to the error of the self calibrating current source. The circuit conformation of the imitative self calibrating current source 201 is substantially identical or similar to the structure of CM-1~CM-n, so as to generate a current nearly identical to that of CM-1~CM-n. The current source reference apparatus 202 is used to generate an ideal bias signal Bid. The error compensation apparatus 203 generates a compensation bias signal Bcp to compensate the error of the self calibrating current sources CM-1~CM-n according to the difference of the error bias signal Ber and the ideal bias signal Bid.

Figure 3:
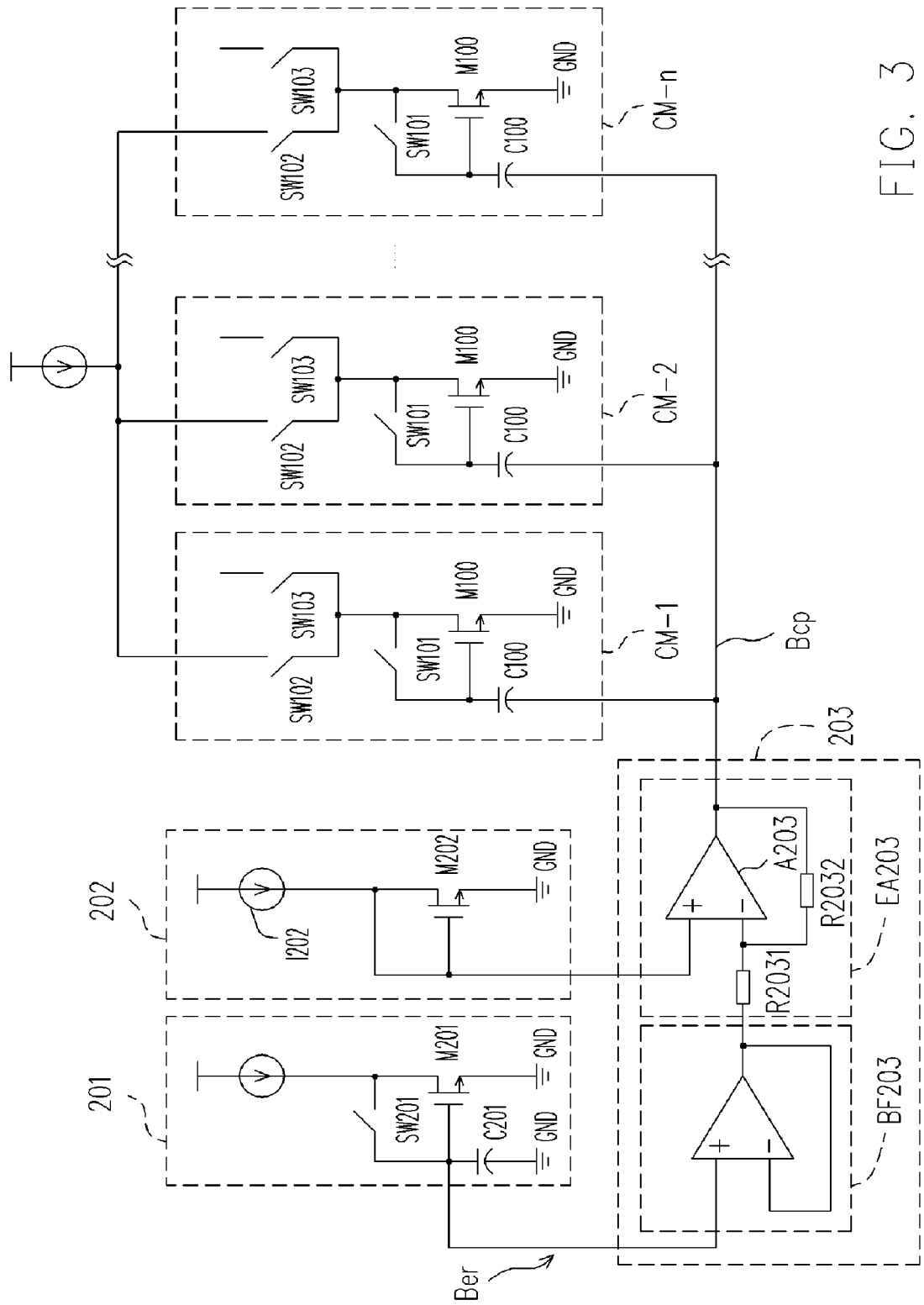
FIG. 3 is a circuit diagram of a further detailed implementation of the apparatus for error compensation of a self calibrating current source of FIG. 2 according to the embodiment of the present invention.

FIG. 3 is a circuit diagram of a more detailed implementation of FIG. 2 according to the embodiment of the present invention. The imitative self calibrating current source 201 includes a second transistor M201, a second capacitor C201 and a third switch SW201, respectively simulating the transistor M100, the capacitor C100 and the switch SW101 in the self calibrating current source. Meanwhile, referring to the coupling relation of the imitative self calibrating current source 201 and the self calibrating current sources CM-1~CM-n, one end of the capacitor C201 is coupled to the gate of the transistor M201, as one end of the capacitor C100 in the self calibrating current source is coupled to the gate of the transistor M100. The switch SW201 is coupled to the capacitor C201 and the drain of the transistor M201, as SW101 is coupled to the capacitor C100 and the drain of the transistor M100. The transistors M100 and M201 are both coupled to a first potential GND (in the embodiment, the ground potential serves as an embodiment of the first potential). The voltages stored in the capacitors C100 and C201 respectively serve as the transistor bias for the transistors M100 and M201 to determine the currents respectively flowing through the transistors M100 and M201.

As the imitative self calibrating current source 201 simulates the structure of the self calibrating current sources CM-1~CM-n, and is fabricated by the same semiconductor process, the same error as that of the self calibrating current sources CM-1~CM-n may occur. In the embodiment, the capacitor C201 corresponding to the capacitor C100 in the self calibrating current source is adopted, and the voltage of the coupling node between the capacitor C201 and the gate of the transistor M201 serves as the error bias signal Ber.

In the embodiment, the current source reference apparatus 202 includes a reference current source I202 and a third transistor M202. The gate of the transistor M202 is coupled to the drain thereof and the reference current source I202, and the source is coupled to the first potential GND. In the embodiment, as the reference current source I202 provides an ideal current to the transistor M202, the ideal current is the current provided when the self calibrating current sources CM-1~CM-n have no error. At this time, the voltage (Vgs) between the gate and the source of the transistor M202 is the ideal bias. The voltage between the gate and the source of the transistor M202 serves as the ideal bias signal Bid.

In the embodiment, the error compensation apparatus 203 includes a buffer amplifier BF203 and an error amplifying circuit EA203. The output end of the buffer amplifier BF203 is coupled to the negative input end to serve as a unit gain amplifier. The positive end of the buffer amplifier BF203 receives the error bias signal Ber to isolate the capacitor C201 and the error amplifying circuit EA203. The error amplifying circuit EA203 includes a first resistance R2031, a second resistance R2032 and an amplifier A203. One end of the resistance R2031 is coupled to the output end of the buffer amplifier BF203, and the other end is coupled to the negative input end of the amplifier A203. The resistance R2032 is coupled between the negative input end and the output end of the amplifier A203. The positive input end of the amplifier receives the ideal bias signal Bid output by the current source reference apparatus 202, and the output end of the amplifier is coupled to each capacitor C100.

When the undesired effects occur, the charges stored in the capacitor C100 and the capacitor C201 may lose simultaneously, thus resulting in current distortion of the self calibrating current sources CM-1~CM-n and the imitative self calibrating current source 201. The error bias signal Ber is output to the error amplifying circuit EA203 via the buffer amplifier BF203. The error amplifying circuit EA203 receives the error bias signal Ber output by the buffer amplifier BF203 and the ideal bias signal Bid output by the current source reference apparatus 202 at the same time. After the comparison between the error bias signal Ber and the ideal bias signal Bid, the difference of the two signals is amplified by the amplifier to generate a compensation bias signal Bcp, so as to raise the voltage at the coupling node between the capacitor C201 and the transistor M100 to an ideal bias before the current leakage. Moreover, in practice, the compensation bias signal Bcp is conditioned by adjusting the resistors R2031 and R2032.

Figure 4:
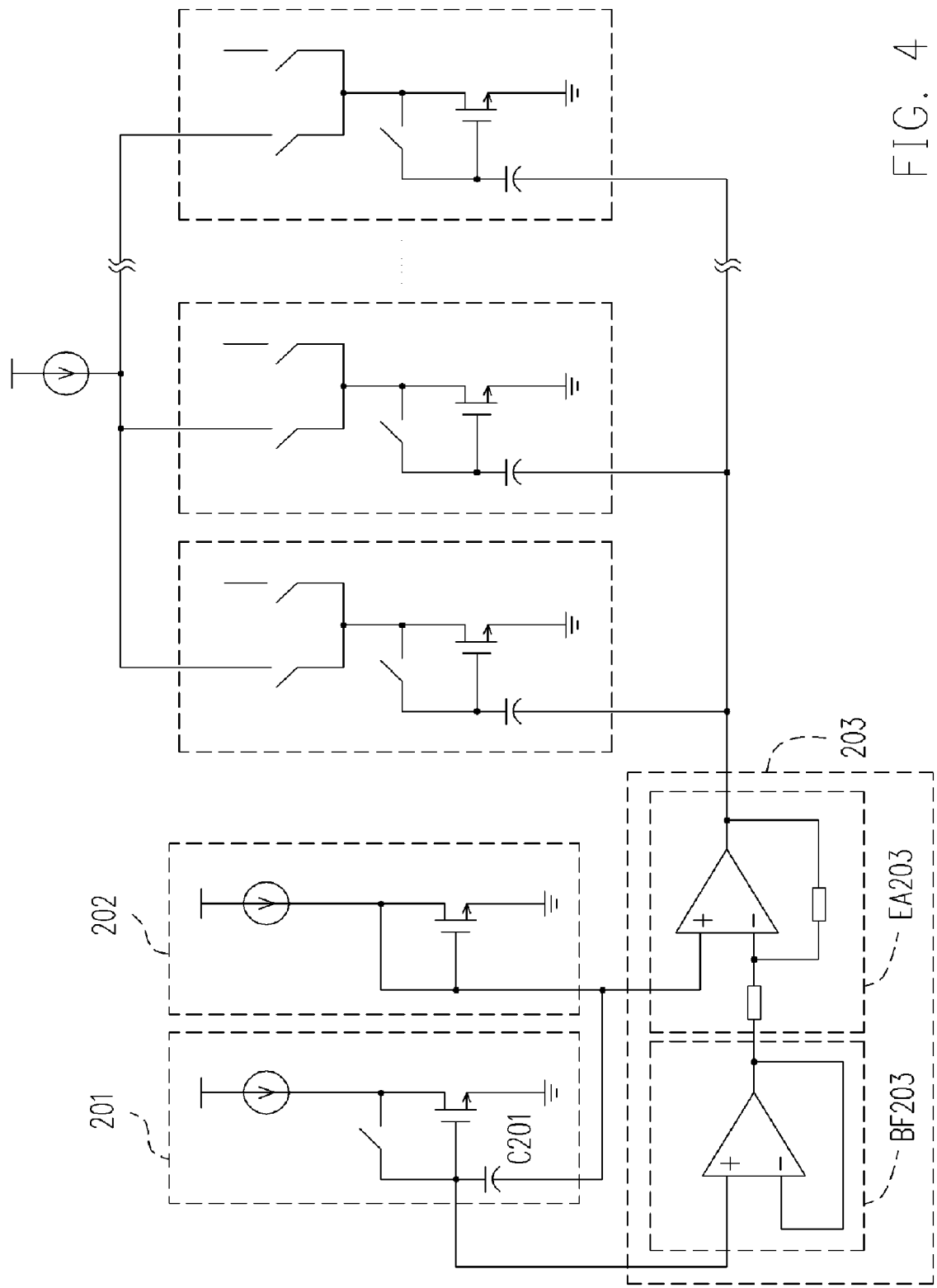
FIG. 4 is a circuit diagram of another detailed implementation of the apparatus for error compensation of a self calibrating current source of FIG. 2 according to the embodiment of the present invention.

FIG. 4 is a circuit diagram of another detailed implementation of FIG. 2 according to the embodiment of the present invention. Referring to FIG. 3 and FIG. 4, the difference between the two embodiments is that the capacitor C201 in FIG. 3 is coupled between the first potential GND and the gate of the transistor M201, while in FIG. 4, the capacitor C201 is coupled between the gate of the transistor M201 and the positive input end of the amplifier A203. As the capacitors in the self calibrating current sources CM-1~CM-n are grounded, but coupled to the output end of the amplifier A203, to make the imitative self calibrating current source 201 more similar to the self calibrating current sources CM-1~CM-n, the capacitor C201 in the embodiment of FIG. 3 is coupled between the gate of the transistor M201 and the positive input end of the amplifier A203. As such, the imitative self calibrating current source 201 can simulate the error of the self calibrating current sources CM-1~CM-n more precisely, thereby achieving a more accurate compensation bias signal Bcp.

Figure 5:
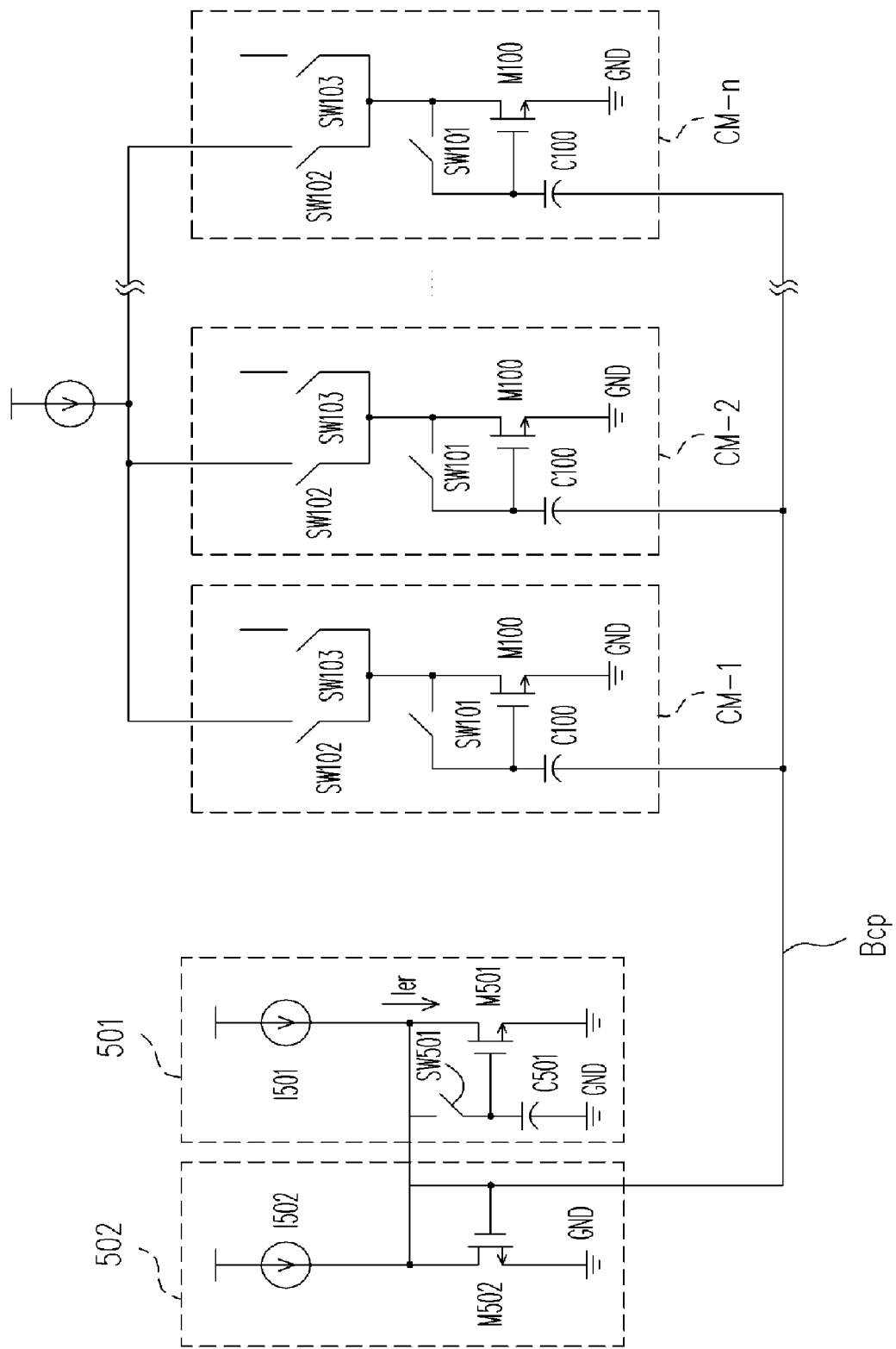
FIG. 5 is a circuit diagram of an apparatus for error compensation of a self calibrating current source according to the embodiment of the present invention.

FIG. 5 is a circuit diagram of an apparatus for error compensation of a self calibrating current source according to another embodiment of the present invention. Referring to FIG. 5, the circuit includes an imitative self calibrating current source 501 and an error compensation apparatus 502. The imitative self calibrating current source 501 is used to simulate the structure of the self calibrating current sources CM-1~CM-n to generate an error current signal Ier as the error of the self calibrating current sources CM-1~CM-n. The error compensation apparatus 502 receives the error current signal Ier, and generates a compensation bias signal to compensate the error of the self calibrating current sources CM-1~CM-n according to the error current signal Ier.

The imitative self calibrating current source 501 includes a reference current source I501, a second transistor M501, a second capacitor C501 and a third switch SW501. The source of the second transistor M501 is coupled to the first voltage GND, and the drain is coupled to the reference current source I501. One end of the second capacitor C501 is coupled to the gate of the second transistor M501, and the other end is coupled to the first voltage GND. The first end of the third switch SW501 is coupled to the gate of the first transistor M501, and the second end is coupled to the drain of the second transistor M501. The error compensation apparatus 502 includes a current source I502 and a third transistor M502. The source of the third transistor M502 is coupled to the first voltage GND, the gate is coupled to the drain, and the drain is coupled to the drain of the second transistor M501.

When the undesired effects occur, the charges stored in the capacitor C100 and the capacitor C201 may lose simultaneously, thus resulting in current distortion of the self calibrating current sources CM-1~CM-n and the imitative self calibrating current source 501. The current flowing through the transistor M501 becomes small. As the reference current source I501 provides a constant current, the excessive current is forced to flow through the transistor M502. The increase in the current flowing through the transistor M502 causes the voltage (Vgs) between the gate and the source of the transistor M502 to increase. Since the voltage of the gate of the transistor M502 serves as the compensation bias signal Bcp, the voltage at the coupling node between the capacitor C100 and the transistor M100 will be raised to an ideal voltage before the current leakage.

Comparing the embodiment of FIG. 5 with the foregoing embodiment of FIG. 2, it can be seen that the present embodiment can not only compensate errors of the replicated current caused by the undesired effects of the switches in the self calibrating current sources CM-1~CM-n, but also reduce the cost due to its simple structure. The cost-saving embodiment can further raise the competitiveness of the product.

Figure 6:
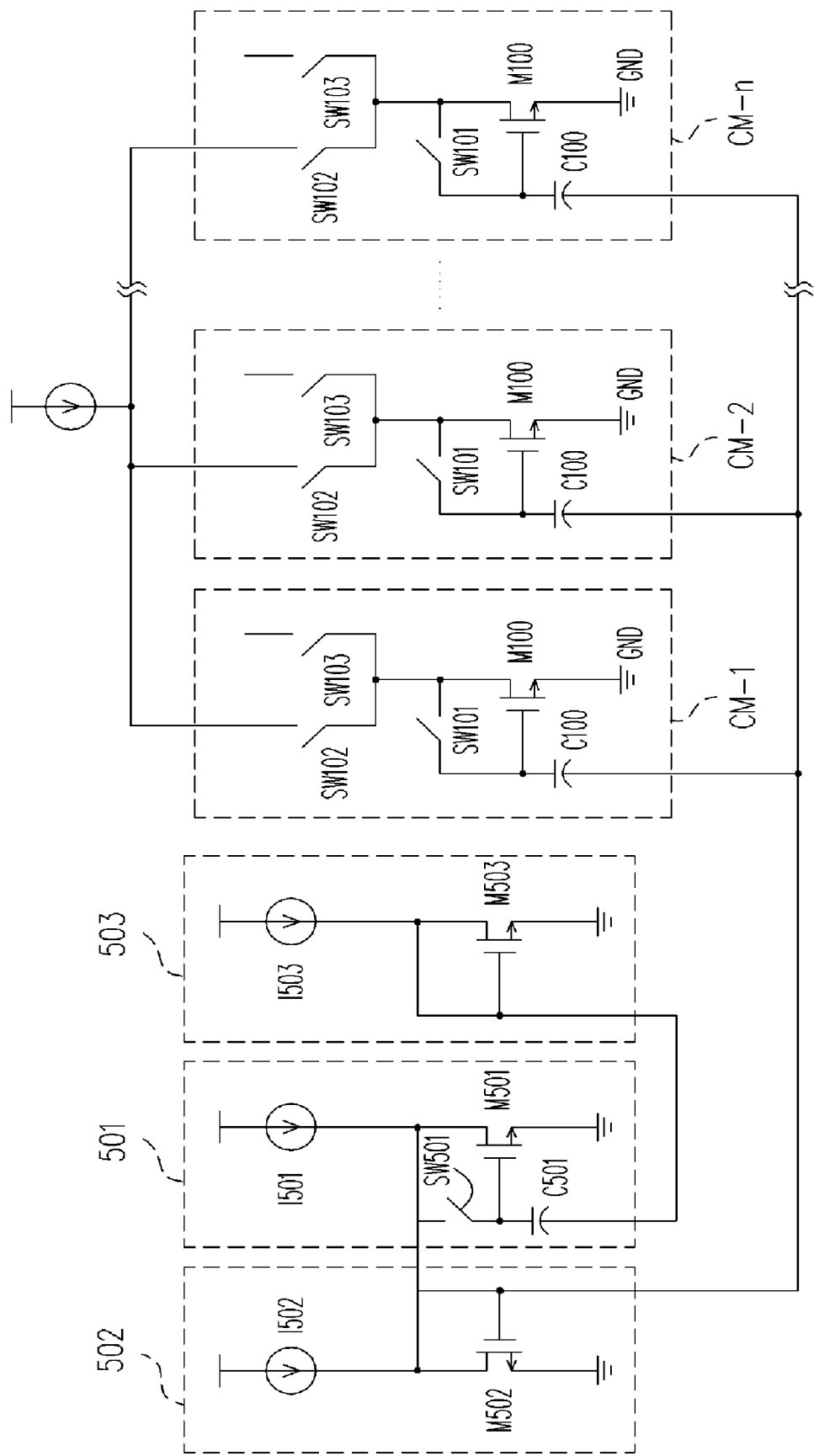
FIG. 6 is a circuit diagram of a further detailed implementation of the apparatus for error compensation of a self calibrating current source of FIG. 5 according to the embodiment of the present invention.

FIG. 6 is a circuit diagram of a further implementation of the apparatus for error compensation of a self calibrating current source according to the embodiment in FIG. 5 of the present invention. Compared with the embodiment of FIG. 5, the present embodiment further includes a current source reference apparatus 503. The current source reference apparatus includes a fourth transistor M503 and a current source I503. The source of the transistor M503 is coupled to the first voltage GND, and the gate is coupled to the drain of the transistor M503 and the other end of the second capacitor C501. As the capacitor C100 in the self calibrating current sources CM-1~CM-n is not grounded, to make the imitative self calibrating current source 501 more similar to the self calibrating current sources CM-1~CM-n, the capacitor C501 in the embodiment of FIG. 5 is coupled to the gate of the transistor M503. By the same method as that of the embodiment of FIG. 4, the imitative self calibrating current source 501 can simulate the error of the self calibrating current sources CM-1~CM-n more precisely, thereby achieving a more accurate compensation bias signal Bcp.

In view of the above, the present invention adopts the imitative self calibrating current source to simulate the structure of the self calibrating current source, so as to generate an error as the error of the self calibrating current source to serve as a reference. On one hand, after the error bias signal of the imitative self calibrating current source is compared with an ideal bias, a compensation bias signal is generated to bias the self calibrating current, so as to compensate the error of the replicated current caused by the current leakage of the capacitor in the self calibrating current source, and compensate the error of the replicated current caused by the undesired effects of the switches. On the other hand, the error current of the imitative self calibrating current source is transferred to the error compensation apparatus. Next, the error compensation apparatus generates a compensation bias signal according to the current, so as to bias the self calibrating current. Therefore, the foregoing undesired effects can be compensated at a very small cost.

Though the present invention has been disclosed above by the preferred embodiments, they are not intended to limit the present invention. Anybody skilled in the art can make some modifications and variations without departing from the spirit and scope of the invention. Therefore, the protecting range of the invention falls in the appended claims.

What is claimed is:

1. An apparatus for error compensation of a self calibrating current source, used to compensate errors of at least one self calibrating current source, the apparatus comprising:
   an imitative self calibrating current source, for simulating the structure of the self calibrating current source to generate an error bias signal in response to the error of the self calibrating current source;
   a current source reference apparatus, for generating an ideal bias signal; and
   an error compensation apparatus, for receiving the error bias signal and the ideal bias signal, and generating a compensation bias signal to compensate the error of the self calibrating current source according to the difference of the error bias signal and the ideal bias signal.

2. The apparatus for error compensation of a self calibrating current source as claimed in claim 1, wherein the self calibrating current source comprises:
   a first transistor, wherein the source is coupled to a first voltage, and the current flowing through the first transistor is determined by the bias of the gate and the source thereof;
   a first capacitor, with one end coupled to the gate of the first transistor, and the other end receiving the compensation bias signal;
   a first switch, having a first end and a second end, wherein the first end is coupled to the gate of the first transistor, and the second end is coupled to the drain of the first transistor; and
   a second switch, having a first end and a second end, wherein the first end is coupled to a current source, and the second end is coupled to the second end of the first switch.

3. The apparatus for error compensation of a self calibrating current source as claimed in claim 1, wherein the imitative self calibrating current source comprises:
   a second transistor, wherein the source thereof is coupled to a first voltage, and the current flowing through the second transistor is determined by the bias of the gate and the source thereof;
   a second capacitor, with one end coupled to the gate of the second transistor, and the other end coupled to the first voltage; and
   a third switch, having a first end and a second end, wherein the first end is coupled to the gate of the first transistor, and the second end is coupled to the drain of the second transistor,
   wherein, the voltage of the gate of the second transistor serves as the error bias signal.

4. The apparatus for error compensation of a self calibrating current source as claimed in claim 1, wherein the current source reference apparatus comprises:
   a reference current source;
   a third transistor, with the source coupled to a first voltage, the gate and the drain coupled to the reference current source,
   wherein, the voltage of the gate of the third transistor serves as the ideal bias signal.

5. The apparatus for error compensation of a self calibrating current source as claimed in claim 1, wherein the error compensation apparatus comprises:
   a buffer amplifier, having a first input end, a second input end and an output end, wherein the output end is coupled to the second input end, and the first input end receives the error bias signal; and
   an error amplifying circuit, having a first input end, a second input end and an output end, with the first input end receiving the ideal bias signal, and the second input end coupled to the output end of the buffer amplifier, wherein the error amplifying circuit amplifies the difference of the signals of the first output end and the second output end to generate the compensation bias signal output at the output end.

6. The apparatus for error compensation of a self calibrating current source as claimed in claim 5, wherein the imitative self calibrating current source comprises:
   a second transistor, wherein the source is coupled to a first voltage, and the current flowing through the second transistor is determined by the bias of the gate and the source thereof;
   a second capacitor, with one end coupled to the gate of the second transistor, and the other end coupled to the first input end of the error amplifying circuit; and
   a third switch, having a first end and a second end, wherein the first end is coupled to the gate of the first transistor, and the second end is coupled to the drain of the second transistor,
   wherein, the voltage of the gate of the second transistor serves as the error bias signal.

7. The apparatus for error compensation of a self calibrating current source as claimed in claim 5, wherein the error amplifying circuit comprises:
   a first resistance, wherein one end is the second input end of the error amplifying circuit;
   an amplifier, having a positive input end, a negative input end and an output end, wherein the negative input end is coupled to the other end of the first resistance, the positive input end is the first input end of the error amplifying circuit, and the output end is the output end of the error amplifying circuit; and
   a second resistance, with one end coupled to the negative input end of the amplifier, and the other end coupled to the output end of the amplifier.

8. The apparatus for error compensation of a self calibrating current source as claimed in claim 1, wherein the imitative self calibrating current source comprises:
   a second transistor, wherein the source is coupled to a first voltage, and the current flowing through the second transistor is determined by the bias of the gate and the source thereof;
   a second capacitor, with one end coupled to the gate of the second transistor, and the other end coupled to the error compensation apparatus; and
   a third switch, having a first end and a second end, wherein the first end of the third switch is coupled to the gate of the first transistor, and the second end is coupled to the drain of the second transistor,
   wherein, the voltage of the gate of the second transistor serves as the error bias signal.

9. An apparatus for error compensation of a self calibrating current source, used to compensate errors of at least one self calibrating current source, the apparatus comprising:

an imitative self calibrating current source, for simulating the structure of the self calibrating current source to generate an error current signal in response to the error of the self calibrating current source; and an error compensation apparatus, for receiving the error current signal, and generating a compensation bias signal to compensate the error of the self calibrating current source according to the error current signal.

10. The apparatus for error compensation of a self calibrating current source as claimed in claim 9, wherein the self calibrating current source comprises:

a first transistor, wherein the source of the first transistor is coupled to a first voltage, and the current flowing through the first transistor is determined by the bias of the gate and the source thereof;

a first capacitor, with one end coupled to the gate of the first transistor, and the other end receiving the compensation bias signal;

a first switch, having a first end and a second end, wherein the first end is coupled to the gate of the first transistor, and the second end is coupled to the drain of the first transistor; and a second switch, having a first end and a second end, wherein the first end is coupled to a current source, and the second end is coupled to the second end of the first switch.

11. The apparatus for error compensation of a self calibrating current source as claimed in claim 9, wherein the imitative self calibrating current source comprises:

a reference current source;

a second transistor, wherein the source is coupled to a first voltage, the drain is coupled to the reference current source, and the current flowing through the second transistor is determined by the bias of the gate and the source thereof;

a second capacitor, with one end coupled to the gate of the second transistor, and the other end coupled to the first voltage; and a third switch, having a first end and a second end, wherein the first end is coupled to the gate of the first transistor, and the second end is coupled to the drain of the second transistor.

12. The apparatus for error compensation of a self calibrating current source as claimed in claim 11, wherein the error compensation apparatus comprises:

a third transistor, with the source coupled to the first voltage, the gate coupled to the drain, and the drain coupled to the drain of the second transistor, wherein, the voltage of the gate of the third transistor serves as the compensation bias signal to compensate the error of the self calibrating current source.

13. The apparatus for error compensation of a self calibrating current source as claimed in claim 9, wherein the imitative self calibrating current source comprises:

a reference current source;

a second transistor, wherein the source is coupled to a first voltage, the drain is coupled to the reference current source, and the current flowing through the second transistor is determined by the bias of the gate and the source thereof;

a second capacitor, with one end coupled to the gate of the second transistor, and the other end coupled to a second voltage; and a third switch, having a first end and a second end, wherein the first end is coupled to the gate of the first transistor, and the second end is coupled to the drain of the second transistor.

14. The apparatus for error compensation of a self calibrating current source as claimed in claim 13, wherein the first voltage is identical to the second voltage.

15. The apparatus for error compensation of a self calibrating current source as claimed in claim 13, wherein the error compensation apparatus comprises:

a third transistor, with the source coupled to the first voltage, the gate coupled to the drain, and the drain coupled to the drain of the second transistor, wherein, the voltage of the gate of the third transistor serves as the compensation bias signal to compensate the error of the self calibrating current source.

16. The apparatus for error compensation of a self calibrating current source as claimed in claim 13, further comprising a current source reference apparatus, wherein the current source reference apparatus comprises:

a current source; and a fourth transistor, with the source coupled to a first voltage, the drain coupled to the current source, and the gate coupled to the drain and the second voltage.

* * * * *